(12) United States Patent
Asano et al.

(10) Patent No.: US 7,576,585 B2
(45) Date of Patent: Aug. 18, 2009

(54) DELAY CIRCUIT

(75) Inventors: Shigetaka Asano, Kasugai (JP); Kazuyoshi Kikuta, Yokohama (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 12/047,162

(22) Filed: Mar. 12, 2008

(65) Prior Publication Data

US 2008/0224751 A1    Sep. 18, 2008

(30) Foreign Application Priority Data

Mar. 14, 2007    (JP) .............................. 2007-065346

(51) Int. Cl.
*H03H 11/26* (2006.01)

(52) U.S. Cl. ...................... 327/276; 327/277; 327/261; 327/284

(58) Field of Classification Search ......... 327/261–266, 327/269–272, 277, 278, 281, 284, 285, 288
See application file for complete search history.

(56) References Cited

U.S. PATENT DOCUMENTS 5,977,809 A * 11/1999 Wang et al. ................. 327/239
6,225,843 B1 * 5/2001 Taniguchi et al. ........... 327/158
7,403,056 B2 * 7/2008 Qu et al. ..................... 327/269
2004/0051576 A1 * 3/2004 Zhang et al. ................. 327/276

FOREIGN PATENT DOCUMENTS

JP    6-021761 A    1/1994

* cited by examiner

*Primary Examiner*—Long Nguyen
*Assistant Examiner*—Sibin Chen
(74) *Attorney, Agent, or Firm*—Arent Fox LLP

(57) ABSTRACT

A delay circuit, including: a plurality of first delay units coupled in series and each configured to generate a delay time that is approximately double a unit delay time; a second delay unit configured to generate the unit delay time and coupled to a last stage of the plurality of first delay units; and a selector configured to select either an output signal of the last stage of the plurality of first delay units or an output signal of the second delay unit, wherein an external input signal is input to the first delay unit and to each second delay unit, and the first delay unit and the second delay unit each include a switch circuit configured to output with a delay either an output signal of a previous stage delay unit or the external input signal.

10 Claims, 5 Drawing Sheets

FIG. 5

| DELAY TIME | NUMBER OF DELAY STAGES |
|---|---|
| 1 | 60 ps +/−e1 |
| 2 | 100 ps +/−e2 |
| 3 | (100 ps +/−e2) + (60 ps +/−e1) |
| 4 | 2 × (100 ps +/−e2) |
| 5 | 2 × (100 ps +/−e2) + (60 ps +/−e1) |
| ... | ... |
| 31 | 15 × (100 ps +/−e2) + (60 ps +/−e1) |
| 32 | 16 × (100 ps +/−e2) |

US 7,576,585 B2

DELAY CIRCUIT

CROSS-REFERENCE TO RELATED APPLICATIONS

This application is based upon and claims the benefit of priority from prior Japanese Patent Application No. 2007-65346 filed on Mar. 14, 2007, the entire contents of which are incorporated herein by reference.

BACKGROUND

1. Field

The embodiments discussed herein are directed to a delay circuit for generating minute delay times.

2. Description of the Related Art

As circuits for generating minute delay times, circuits constructed by series-connecting unit delay devices, each of which generates a minimum unit delay time, to form a plurality of stages have been proposed. In such circuits, it is possible to vary the generated delay times by adjusting the number of connected unit delay device stages.

In such delay circuits, to reduce error between a desired delay time and an actual generated delay time, it is effective to shorten the delay time of the unit delay device. However, shortening the delay time of the unit delay device increases power consumption by the unit delay devices. Consequently, the power consumption of semiconductor integrated circuit devices including such delay circuits increases.

To deal with this, Japanese Patent Application Laid-open No. H6-21761 discloses a delay circuit which reduces the error in the generated delay time while suppressing the increase in power consumption. This delay circuit includes a circuit having a single delay circuit which generates a unit delay time T connected in series with a plurality of delay circuits which each generate a double unit delay time 2T and a circuit having a plurality of series-connected delay circuits which generate a unit delay time 2T, and through parallel operation of the two circuits, allows generation of delay times of 2T, 3T, 4T, 5T . . . .

With such a construction, since it is possible to generate the delay times 2T, 3T, 4T, 5T . . . with only a single delay circuit generating the unit delay time T, a reduction in power consumption can be realized.

However the delay circuit disclosed in the Japanese Patent Application Laid-open No. H6-21761 has a problem in that it is necessary to constantly operate the circuit having the single delay circuit which generates the unit delay time T connected in series with the plurality of delay circuits which each generate a double unit delay time 2T and the circuit having the plurality of series-connected delay circuits which generate the unit delay time 2T, and consequently the power consumption remains high.

Moreover, since the delay circuit is constructed to select one of the delay times 2T, 3T, 4T, 5T . . . for output using a multiple input multiplexer, the time taken by multiplexer operations is a source of error in the delay time when generating minute delay times. The delay circuit has a further problem in that inclusion of the multi-input multiplexer causes an increase in circuit area.

SUMMARY

It is an aspect of the embodiments discussed herein to provide a delay circuit, including a plurality of first delay units coupled in series and each configured to generate a delay time that is approximately double a unit delay time; a second delay unit configured to generate the unit delay time and coupled to a last stage of the plurality of first delay units; and a selector configured to select either an output signal of the last stage of the plurality of first delay units or an output signal of the second delay unit, wherein an external input signal is input to each first delay unit and to second delay unit, and wherein the first delay unit and the second delay unit each include a switch circuit configured to output with a delay either an output signal of a previous stage delay unit or the external input signal.

Additional advantages and novel features of aspects of the present invention will be set forth in part in the description that follows, and in part will become more apparent to those skilled in the art upon examination of the following or upon learning by practice thereof.

BRIEF DESCRIPTION OF THE DRAWINGS

FIG. 5 is a diagram illustrating an exemplary delay time when a number of connected delay unit stages is sequentially increased.

DETAILED DESCRIPTION OF EMBODIMENTS OF THE INVENTION

Figure 1:
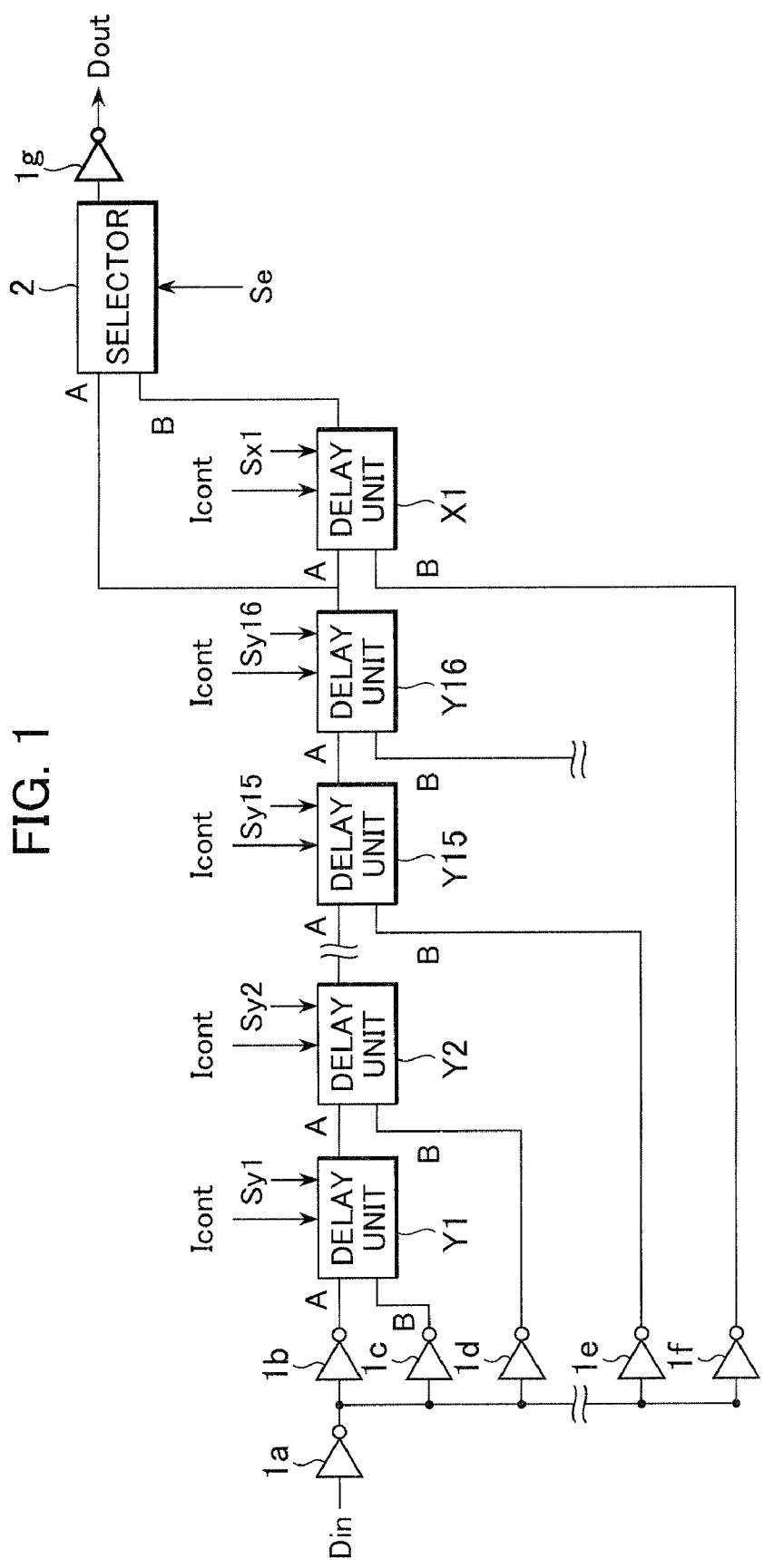
FIG. 1 is a block diagram illustrating a delay circuit in accordance with a first embodiment.

The following describes a first embodiment of the present invention with reference to the drawings. The delay circuit shown in FIG. 1 is constructed by connecting a single delay unit X1 which generates a unit delay time T to a 16-stage delay unit Y1 through Y16 which each generate a delay time 2T that is double the unit delay time T. It is desirable that the minimum value of the unit delay time T generated by the delay unit X1 is 50 ps. Currently, however, it is not possible to generate a delay time of less than 60 ps, and so in an embodiment a delay time of 60 ps is used as the unit delay time T, and a delay time of 100 ps is used as the unit delay time 2T generated by each of the delay units Y1 through Y16.

Two input signals A and B are input into each of the delay units X1 and Y1 through Y16 shown in FIG. 1. The delay units Y1 through Y16 are connected in series with the output from each unit being input to the delay unit of the next stage as the input signal A. The output signal of the final stage delay unit Y16 is then input to the delay unit X1 as the input signal A.

An input signal Din is input to the first stage delay unit Y1 as the input signal A via inverter circuits 1a and 1b which operate as buffer circuits. The input signal Din is further input to the first stage delay unit Y1 as the input signal B via inverter circuits 1a and 1c.

The input signal Din is input to the next stage delay unit Y2 as the input signal B via inverter circuits 1a and 1d. The input signal Din is input to the delay unit Y15 as the input signal B via inverter circuits 1a and 1e. The input signal Din is input to the delay unit Y16 as the input signal B via inverter circuits 1a and 1f. In this way, the input signal Din is input to each of the delay units Y1 through Y16 as the input signal B via a two-stage inverter circuit. Hence, the input signal Din is input to each of the delay units Y1 through Y16 as the input signal B via the corresponding two-stage inverter which operates as a buffer circuit.

An output signal of the delay unit Y16 is inputted to a selector 2 as the input signal A. An output signal of the delay unit X1 is input to the selector 2 as the input signal B. A selection signal Se is input to the selector 2. When the selection signal Se goes to an H level, the selector 2 selects the output signal of the delay unit Y 16, and outputs the selected signal as an output signal OUT. When the selection signal Se goes to an L level, the selector 2 outputs the output signal of the delay unit X1 as the output signal OUT. The output signal of the selector 2 is then output as the output signal Dout via the inverter circuit 1g.

Selection signals Sx1 and Sy1 through Sy16 are input to the corresponding delay units X1 and Y1 through Y16. The delay units X1 and Y1 through Y16 each select and output a signal input at either input terminal A or input terminal B according to the corresponding selection signal among selection signals Sx1 and Sy1 through Sy16.

A control current Icont is also input to the delay units X1 and Y1 through Y16. Each of the delay units X1 and Y1 through Y16 is constructed to have a delay time which can be adjusted using the control current Icont.

As the circuit construction of each of the delay units X1 and Y1 through Y16 is substantially identical, the delay unit X1 is described below with reference to FIG. 2 as a representative example.

The selection signal Sx1 is supplied to a first delay time generator 3a and a first switch circuit 4a. The selection signal Sx1 is also supplied to a second delay time generator 3b and a second switch circuit 4b via an inverter circuit 5. When the selection signal Sx1 goes to an H level, the first delay time generator 3a is activated, and the first switch circuit 4a switches to a conductive state. On the other hand, when the selection signal goes to an L level thereby sending an output signal of the inverter circuit 5 to an H level, the second delay time generator 3b is activated, and the second switch circuit 4b switches to a conductive state.

When the first delay time generator 3a is activated, the first delay time generator 3a outputs the input signal A, with a delay. When the second delay time generator 3b is activated, the second delay time generator 3b outputs the input signal B, with a delay.

The control current Icont is converted to a voltage by a current-voltage converting circuit 6 and the resulting voltage is supplied to the first and second delay time generators 3a and 3b via the first and second switch circuits 4a and 4b. The first and second delay time generators 3a and 3b are then able to adjust the generated delay times according to the output voltage of the current-voltage converting circuit 6.

The first and second delay time generators 3a and 3b have substantially identical circuit constructions and therefore generate substantially identical delay times when supplied substantially identical voltages from the current-voltage converting circuit 6. Any of the first and second delay time generators 3a and 3b are activated by the selection signal Sx1. The output signal OUT is output from the activated delay time generator.

Figure 2:
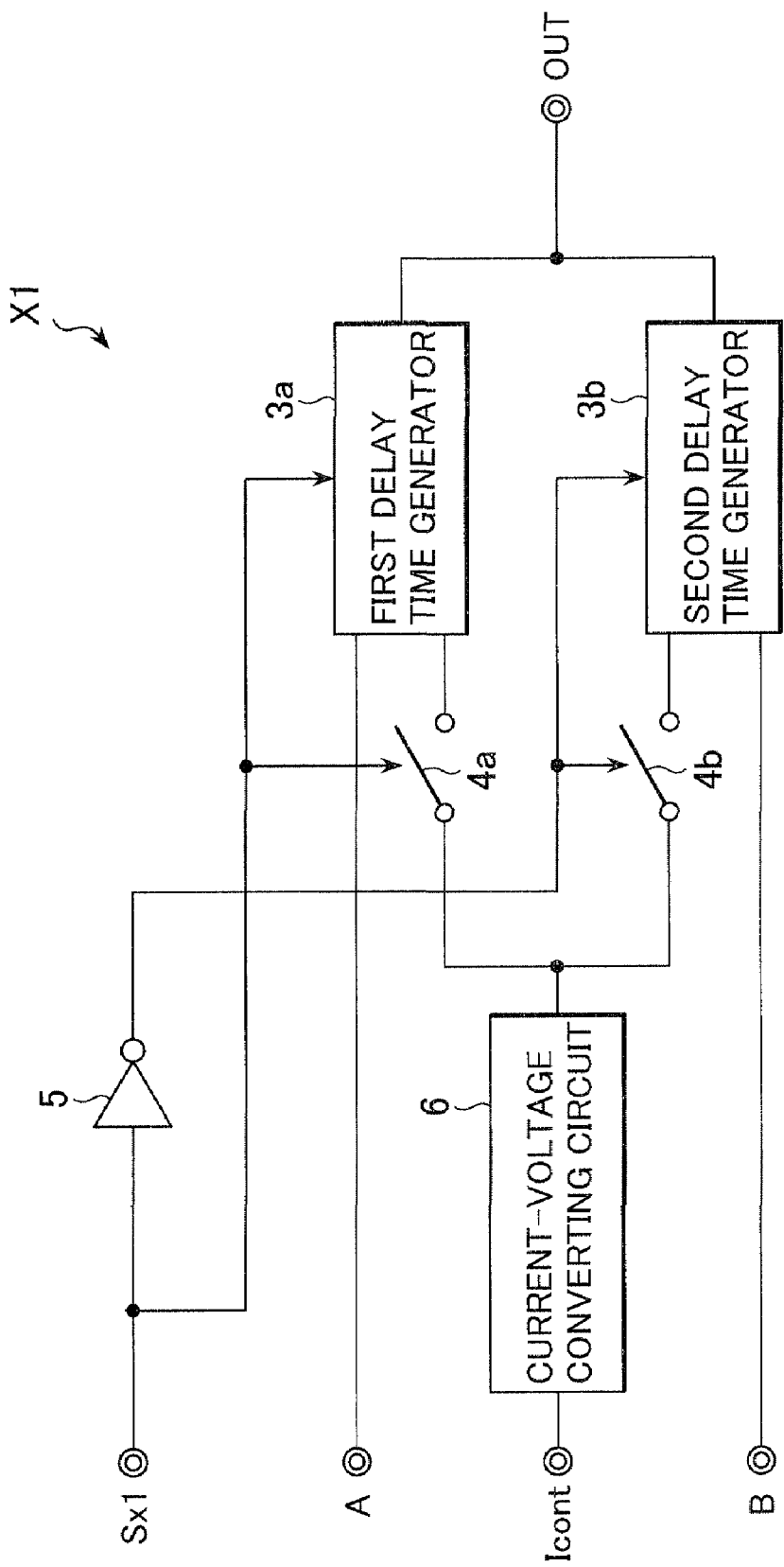
FIG. 2 is a block diagram illustrating aspects of an exemplary delay unit.
Figure 3:
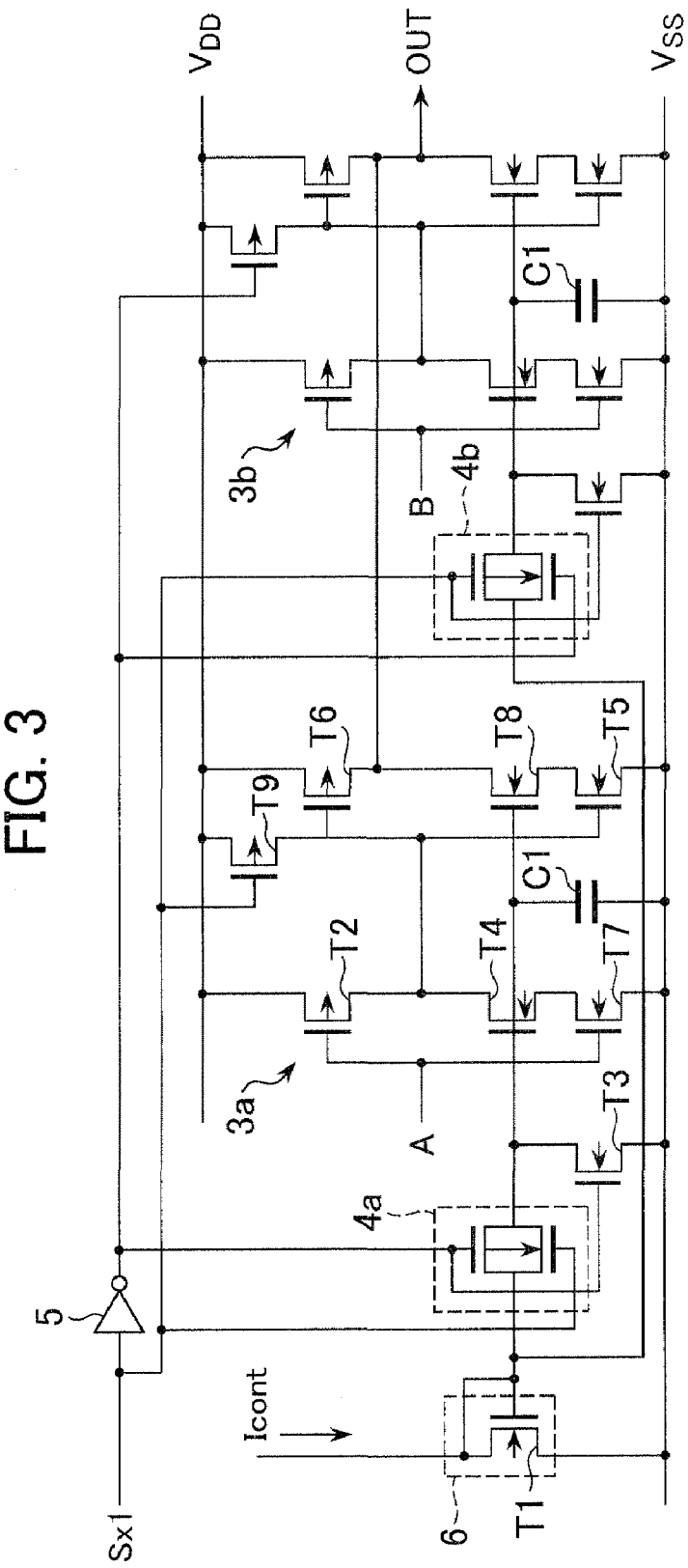
FIG. 3 is a circuit diagram illustrating aspects of an exemplary delay unit.

FIG. 3 shows an example construction of the delay unit X1 shown in FIG. 2. The current-voltage converting circuit 6 is constructed using a diode-connected n-channel MOS transistor T1. The control current Icont is supplied to a drain of the n-channel MOS transistor, and the output voltage is supplied to the first and second switch circuits 4a and 4b from a gate of the n-channel MOS transistor.

The first and second switching circuits 4a and 4b are constructed using a transfer gate. The selection signal Sx1 is input to an n-channel-side gate of the first switch circuit 4a and to a p-channel-side gate of the second switch circuit 4b, and the output signal of the inverter circuit 5 is input to a p-channel-side gate of the first switch circuit 4a and to an n-channel-side gate of the second switch circuit 4b. Hence, the first switch circuit 4a switches to a conductive state when the selection signal Sx1 goes to the H level, and the second switch circuit 4b switches to a conductive state when the selection signal Sx1 goes to the L level.

In the first delay time generator 3a, the input signal A is input to a gate of a p-channel MOS transistor T2 and a gate of an n-channel MOS transistor T3. A source of the transistor T2 is connected to a power supply VDD that is a high potential-side power supply. A source of the transistor T3 is connected to a power supply Vss that is a low potential-side power supply.

An n-channel MOS transistor (activation circuit) T4 is provided between the transistors T2 and T3. An output signal of the first switch circuit 4a is input to a gate of the transistor T4. Also, an n-channel MOS transistor (discharge circuit) T5 is provided between the gate of the transistor T4 and the power supply Vss. An output signal of the inverter circuit 5 is input to a gate of the transistor T5.

Hence, when the first switch circuit 4a is in the conducting state, the transistor T5 is off. When the first switch circuit 4a is switched to a non-conducting state, the transistor T5 is switched on, sending a gate potential of the transistor T4 to a level of the power supply Vss and switching off that same transistor T4.

When the first switch circuit 4a is in a conducting state, the transistor T4 is biased, the transistors T2 and T3 operate as inverter circuits which convert delay values based on an amount of the control current Icont, and the output signals from the transistors T2 and T3 are input to gates of the p-channel MOS transistor T6 and the n-channel MOS transistor T7.

A source of the transistor T6 is connected to the power supply VDD, and a source of the transistor T7 is connected to the power supply Vss. An n-channel MOS transistor T8 is provided between the transistors T6 and T7. An output signal of the first switch circuit 4a is input to a gate of the transistor T8.

Hence, when the first switch circuit 4a is in a conducting state, the transistor T8 is biased, the transistors T6 and T7 operate as inverter circuits which convert delay values based on the amount of control current Icont, and the output signal from the transistors T6 and T7 is output as the output signal OUT. When the first switch circuit 4a is switched to a non-conducting state, the transistor T5 is switched on, the transistor T4 and the transistor T8 are switched off, and the first delay time generator 3a is deactivated.

A p-channel MOS transistor T9 is provided between the gates of the transistors T6 and T7 and the power supply VDD. The selection signal Sx1 is input to a gate of the transistor T9. Hence, the transistor T9 is off when the first switch circuit 4a is in the conducting state, and on when the first switch circuit 4a is in the non-conducting state. When the transistor T9 is on, a gate potential of the transistors T6 and T7 is set to a VDD level.

A capacitor C1 is connected between the gate of the transistor T8 and the power supply Vss to suppress noise in a gate voltage of the transistors T4 and T8.

In the first delay time generator 3a constructed in the described manner, when the first switch circuit 4a is in a conducting state, the transistors T2 and T3 and the transistors T6 and T7 (delay time adjustment unit) operate as an inverter circuit which varies delay values based on the amount of control current Icont. After the delay time set by the control current Icont has passed, the first delay time generator outputs a signal in phase with input signal A as the output signal OUT.

The second delay time generator 3b has a construction substantially the same as the first delay time generator 3a. The second delay time generator 3b also operates in a substantially identical manner to the first delay time generator 3a, except that the second delay time generator 3b is activated when the first delay time generator 3a is deactivated by the selection signal Sx1.

In the delay unit X1 constructed in the above-described manner, when the selection signal Sx1 goes to the H level, the first switch circuit 4a moves into the conducting state, the first delay time generator 3a is activated, and the input signal A is delayed for the delay time set by the control current Icont and then output as the output signal OUT.

On the other hand, when the selection signal Sx1 goes to the L level, the second switch circuit 4b moves into the conducting state, the second delay time generator 3b is activated, and the input signal B is delayed for the delay time set by the control current Icont and the capacitor C1 and then output as the output signal OUT. Also, in the delay unit X1, the first and second delay time generators 3a and 3b are caused to generate a delay time of 60 ps by maximizing the control current Icont.

The delay units Y1 through Y16 have substantially the same circuit constructions as the delay unit X1. However, the generated time delay is adjusted to 100 ps by making adjustments to the gate width and a gate length of the transistors used to construct the first and second delay time generators 3a and 3b.

Figure 4:
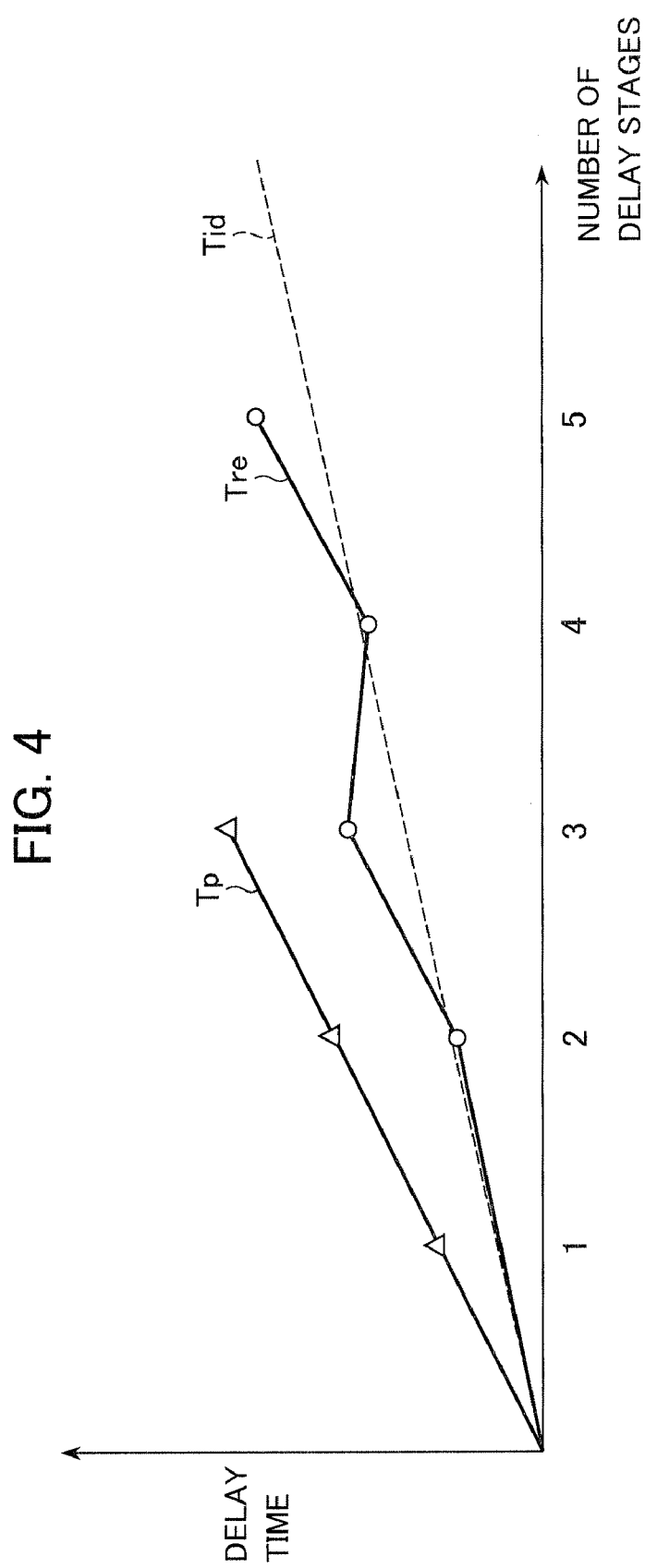
FIG. 4 is diagram illustrating an exemplary relationship between a number of delay stages and a delay time.

The following describes operations of a delay circuit constructed in the manner described above. The operations described are those used when using delay circuits of the type described above in an attempt to generate ideal delay times Tid separated by 50 ps as shown in FIG. 4.

In order to set a minimal delay time, the selection signals Se and Sx1 are set to the L level, and the selection signals Sy1 through Sy16 are set to the H level. With these settings, an input signal Din passes through the inverter circuits 1a and 1f, the delay unit X1, the selector 2, and the inverter circuit 1g, and is output as the output signal Dout. The delay time in this case is 60 ps +/−e1. Here, "e1" is the error generated by the delay unit X1 and the path of the input signal Din.

When the selection signal Sy16 is set to the L level, and the other selection signals Se, Sx1, and Sy1 through Sy15 are set to the H level, the only delay unit passed through by the input signal Din is the delay unit Y16 and the resulting delay time is 100 ps+/−e2. Here, "e2" is the error generated by the delay unit Y16 and the transit path of the input signal Din.

When the selection signals Se and Sy16 are set to the L level, and the other selection signals Sx1 and Sy1 through Sy15 are set to the H level, the only delay units passed through by input signal Din are the delay units Y16 and X1, and the resulting delay time is (100 ps+/−e2)+(60 ps+/−e2).

When the selection signal Sy 15 is set to the L level, and the other selection signals Se, Sx1, Sy1 through Sy14, and Sy16 are set to the H level, the only delay units passed through by input signal Din are the delay units Y15 and Y16, and the resulting delay time is double (100 ps+/−e2).

FIG. 5 shows the delay times which result when the number of connected delay unit stages is sequentially increased in this manner.

In the table shown in FIG. 5, the delay unit X1 which generates the delay time of 60 ps is counted as one stage and the delay units Y1 through Y16 are each counted as two stages.

According to these operations and as shown in FIG. 4, the delay times Tre obtained by adjusting the number of delay stages is approximately 10 ps away from the ideal delay times Tid which are separated by 50 ps for odd numbers of delay stages.

Hence, the error in the delay times Tre with respect to the ideal delay times Tid can be reduced in comparison to an error in delay times Tp which are obtained by adjusting a number of stages of series-connected 60 ps delay units.

The delay circuit constructed in the manner described above has the following advantages. (1) With respect to the ideal unit delay time of 50 ps, by selecting a number connected stages made up of the delay unit X1 which generates the delay time of 60 ps and the multi-stage delay units Y1 through Y16 which each generate the delay time of 100 ps, a figure double the ideal unit delay time of 50 ps, it is possible to generate the delay times Tre which have small errors with respect to the ideal delay times Tid. (2) Even when the number of the delay units Y1 through Y16 connected in stages is increased, the maximum value of error with respect to the ideal delay times Tid can be kept to approximately 10 ps (i.e. the difference between the ideal unit delay time of 50 ps and the delay time of 60 ps generated by the delay unit X1). Hence, it is possible to generate the delay times Tre having a small error with respect to the ideal delay times Tid irrespective of any increase in the number of connected stages. (3) As only one delay unit X1 requiring a large control current Icont to generate the minimum delay time of 60 ps is used, and the other circuits are the delay units Y1 through Y16 which only require small control currents Icont, it is possible to reduce power consumption. (4) As the number of connected stages in the delay circuit is selected by selecting either input signal A or input signal B in each of the delay units Y1 through Y16 and X1, apsects of the present embodiment differ from the conventional example in that there is no need for parallel operation of the circuit for generating odd-numbered multiples of the unit delay time and the circuit for generating even-numbered multiples of the unit delay time. As a result, it is possible to reduce the power consumption. (5) The above-described delay circuit includes the first and second delay time generators 3a and 3b which generate substantially identical delay times to allow each of the delay units Y1 through Y16 and X1 to select one of the input signals A and B and output accordingly. However, since only one of the first and second delay time generators 3a and 3b is activated at any given time by the selection signals Sy1 through Sy16 and Sx1, it is possible to reduce power consumption. (6) There is no need to use a multi-input multiplexer to select the delay time. As a result, it is possible to reduce the power consumption and reduce the circuit area. Moreover, delay time errors caused by multiplexer operations can be prevented. (7) By laying out the delay units Y1 through Y16 and X1 of the first and second delay time generators 3a and 3b in proximity on the substrate, it is possible to reduce the delay time differences between the first and second delay time generator 3a and 3b which occur as result of the manufacturing process. (8) In a delay devices manufactured using an 0.18 micron process, for instance, even when the ideal unit delay time of 50 ps cannot be realized and the unit delay time is the smallest value of 60 ps, it is possible to generate the delay times Tre which have small errors by providing the delay units Y1 through Y16 which each generate a delay time that is double the ideal unit delay time of 50 ps. (9) Having the transistor T5 switch on when the first and second switch circuits 4a and 4b are switched to a non-conducting state makes it possible to reliably drop the gate voltage of the transistor T4 and T8 decends to a level approximately equal to the supply voltage Vss. Hence, it is possible to reliably switch the transistors T4 and T8 from a biased state to a non-conducting state, and reduce the time required to switch from the biased state to the non-conducting state. (10) Since the control current Icont can be converted to a voltage value using the single transistor T1, it is possible to avoid an increase in circuit area.

The above-described embodiment may further be implemented in the manner described below. The delay times generated by the delay units Y1 through Y16 and X1 may be set to values other than 100 ps and 60 ps.

According to aspects of the above-described embodiments, it is possible to supply a delay circuit capable of realizing reduced power consumption and reduced error in generated delay times.

Example embodiments of aspects of the present invention have now been described in accordance with the above advantages. It will be appreciated that these examples are merely illustrative of aspects of the present invention. Many variations and modifications will be apparent to those skilled in the art.

What is claimed is:

1. A delay circuit, comprising:
   a plurality of first delay units coupled in series and each configured to generate a delay time that is approximately double a unit delay time;
   a second delay unit configured to generate the unit delay time and coupled to the last stage of the plurality of first delay units; and
   a selector configured to select either an output signal of the last stage of the plurality of first delay units or an output signal of the second delay unit, wherein
   an external input signal is input to each first delay unit and the second delay unit, and
   the first delay units and the second delay unit each include a switch circuit configured to output, with a delay, either an output signal of a previous stage delay unit or the external input signal.

2. The delay circuit of claim 1, wherein
the first and second delay units each include:
   a first delay time generator configured to output, with a delay, the output signal of the previous stage delay unit; and
   a second delay time generator configured to output, with a delay, the external input signal, and wherein the switch circuit activates any of the first and second delay time generators by supplying a control signal based on a selection signal.

3. The delay circuit of claim 2, wherein
the first delay time generator and the second delay time generator have substantially identical circuits that generate substantially identical delay times.

4. The delay circuit of claim 3, wherein
the first and second delay time generators each include a delay time adjustment unit for adjusting the delay time based on the input control signal, and the first delay unit and the second delay unit have substantially identical circuits.

5. The delay circuit of claim 4, wherein
the first and second delay time generators each include an activation circuit for activating the first and second delay time generators based on the input control signal.

6. The delay circuit of claim 5, wherein
the first and second delay time generators each have an nMOS transistor as the activation circuit in a two stage CMOS inverter circuit, and wherein each nMOS transistor includes at least one gate and the gate is connected to a capacitor.

7. The delay circuit of claim 6, wherein
the first and second delay time generators each include a discharge circuit for discharging the capacitor when the switch circuit is in a non-conducting state.

8. The delay circuit of claim 4 including a current voltage converting circuit, wherein
the control signal is generated by converting a control current to a voltage signal using the current-voltage converting circuit.

9. The delay circuit of claim 8, wherein
the current-voltage converting circuit includes a diode-connected MOS transistor.

10. The delay circuit of claim 1, wherein
the switch circuit includes a transfer gate.

* * * * *